(12) United States Patent
Fukamachi et al.

(10) Patent No.: US 9,287,845 B2
(45) Date of Patent: Mar. 15, 2016

(54) BANDPASS FILTER, HIGH-FREQUENCY DEVICE AND COMMUNICATIONS APPARATUS

(75) Inventors: Keisuke Fukamachi, Tottori (JP); Takahiro Yamashita, Tottori (JP); Takahiro Umeyama, Tottori (JP)

(73) Assignee: HITACHI METALS, LTD., Tokyo (JP)

( * ) Notice: Subject to any disclaimer, the term of this patent is extended or adjusted under 35 U.S.C. 154(b) by 925 days.

(21) Appl. No.: 13/057,513

(22) PCT Filed: Aug. 7, 2009

(86) PCT No.: PCT/JP2009/064050
§ 371 (c)(1),
(2), (4) Date: Feb. 22, 2011

(87) PCT Pub. No.: WO2010/018798
PCT Pub. Date: Feb. 18, 2010

(65) Prior Publication Data
US 2011/0133860 A1    Jun. 9, 2011

(30) Foreign Application Priority Data

Aug. 11, 2008  (JP) .................................. 2008-206667
Aug. 11, 2008  (JP) .................................. 2008-206668
Aug. 28, 2008  (JP) .................................. 2008-220320

(51) Int. Cl.
*H03H 7/09*     (2006.01)
*H03H 7/01*     (2006.01)
(Continued)

(52) U.S. Cl.
CPC ......... *H03H 7/0123* (2013.01); *H01P 1/20345* (2013.01); *H01P 1/2135* (2013.01); *H03H 7/09* (2013.01); *H03H 2001/0085* (2013.01)

(58) Field of Classification Search
CPC .... H03H 7/0115; H03H 7/175; H03H 7/1766
USPC .................. 333/168, 175, 176, 185, 204, 205
See application file for complete search history.

(56) References Cited

U.S. PATENT DOCUMENTS 5,777,533 A     7/1998   Kato et al.
5,898,403 A *   4/1999   Saitoh et al. ........... 343/700 MS
(Continued)

FOREIGN PATENT DOCUMENTS

EP     1850491 A2      10/2007
JP     2000357901 A    12/2000
(Continued)

OTHER PUBLICATIONS

Notice of Reasons for Rejection issued in corresponding JP Application No. 2010-524724, dated Jun. 25, 2013.
(Continued)

*Primary Examiner* — Robert Pascal
*Assistant Examiner* — Gerald Stevens
(74) *Attorney, Agent, or Firm* — Sughrue Mion, PLLC

(57) ABSTRACT

A bandpass filter comprising two or more resonators arranged between two input/output terminals in a laminate substrate comprising pluralities of dielectric layers; each resonator being constituted by a resonance line and a resonance capacitance connected to one end of the resonance line; capacitance electrodes forming said resonance capacitances and said resonance lines being arranged on different dielectric layers, via a planar ground electrode covering the entire structural portion of the bandpass filter when viewed in a lamination direction; and in each of the resonators connected to said two input/output terminals, the junctions of said input/output terminals to said paths between said resonance lines and said resonance capacitances being closer to said resonance capacitances than said resonance lines in a lamination direction.

18 Claims, 12 Drawing Sheets

(51) Int. Cl.
*H01P 1/203* (2006.01)
*H01P 1/213* (2006.01)
*H03H 1/00* (2006.01)

(56) References Cited

U.S. PATENT DOCUMENTS

| | | | |
|---|---|---|---|
| 6,236,290 B1 | 5/2001 | Abe et al. | |
| 6,414,568 B1 * | 7/2002 | Matsumura et al. | 333/185 |
| 6,538,534 B2 | 3/2003 | Hirai et al. | |
| 6,822,534 B2 * | 11/2004 | Uriu et al. | 333/185 |
| 2001/0004228 A1 | 6/2001 | Hirai et al. | |
| 2003/0085780 A1 * | 5/2003 | Wang | H01P 3/088 333/204 |
| 2003/0129957 A1 | 7/2003 | Shingaki et al. | |
| 2007/0013462 A1 | 1/2007 | Fan | |
| 2007/0120627 A1 | 5/2007 | Kundu | |
| 2007/0241839 A1 | 10/2007 | Taniguchi | |
| 2008/0166980 A1 | 7/2008 | Fukamachi et al. | |

FOREIGN PATENT DOCUMENTS

| | | |
|---|---|---|
| JP | 2001177306 A | 6/2001 |
| JP | 2003168945 A | 6/2003 |
| JP | 2003-258587 A | 9/2003 |
| JP | 2008022543 A | 1/2008 |
| TW | I220085 B | 8/2004 |
| WO | 2007064391 A2 | 6/2007 |
| WO | 2007/119356 A1 | 10/2007 |
| WO | 2008/066198 A1 | 6/2008 |
| WO | WO 2008/066198 * 6/2008 | H04B 1/40 |

OTHER PUBLICATIONS

European Search Report issued in European Patent Application No. 09806690.5 on Mar. 14, 2014.

* cited by examiner

BANDPASS FILTER, HIGH-FREQUENCY DEVICE AND COMMUNICATIONS APPARATUS

This is a National Stage of International Application No. PCT/JP2009/064050 filed Aug. 7, 2009, claiming priority based on Japanese Patent Application Nos. 2008-206667 and 2008-206668 filed Aug. 11, 2008 and 2008-220320 filed Aug. 28, 2008, respectively, the contents of all of which are incorporated herein by reference in their entirety.

FIELD OF THE INVENTION

The present invention relates to a bandpass filter used in, for example, mobile communications appliances such as cell phones, wireless communications apparatuses such as wireless LAN for wireless transmission between electronic/electric equipments, etc., and a high-frequency device and a communications apparatus comprising such bandpass filter.

BACKGROUND OF THE INVENTION

Data communications by wireless LAN such as IEEE802.11 are now widely used. The wireless LAN is used, for instance, in personal computers (PCs), PC peripherals such as printers and hard disk drives, electronic equipments such as FAXs, standard televisions (SDTVs), high-definition televisions (HDTVs) and mobile phones, signal-transmitting means in place of wired communications in automobiles and aircrafts, etc.

A high-frequency circuit used in a multiband communications apparatus for such wireless LAN comprises one antenna capable of conducting transmission and reception in two communications systems having different communication frequency bands (for example, IEEE802.11a, and IEEE802.11b and/or IEEE802.11g), and a high-frequency switch for switching connection to a transmitting circuit and a receiving circuit, thereby switching the transmitting circuit and the receiving circuit for two communications systems. As wireless apparatuses have been miniaturized and provided with higher functions, there is increasingly stronger demand to integration and miniaturization on high-frequency devices with high-frequency circuits.

In such high-frequency circuits, bandpass filters selectively passing signals in predetermined bands are important circuits. The bandpass filter is arranged between a front end of an antenna circuit and transmission and receiving circuits, etc. to remove unnecessary waves outside the passband. The bandpass filter is required to have not only steep filtering characteristics near the passband, but also high attenuation in bands such as harmonic bands outside the passband. In addition, it should be miniaturized and have higher functions.

WO 2008/066198 discloses a small, laminate-type bandpass filter comprising three resonators, resonance lines for the resonators being constituted by connecting electrodes formed on pluralities of layers in parallel. The bandpass filter with such structure has low impedance, low insertion loss and excellent attenuation characteristics. However, this bandpass filter suffers electromagnetic coupling between transmission lines, because the resonance lines are constituted by pluralities of transmission lines. When intervals between the resonance lines are narrowed according to the demand of miniaturization, there appears strong electromagnetic coupling, resulting in increased insertion loss. Thus, the bandpass filter of WO 2008/066198 cannot be miniaturized with low insertion loss. Also, because resonance lines are formed on pluralities of dielectric layers, filtering characteristics vary with the lateral displacement of lamination putting the resonance lines out of alignment in a lamination direction.

OBJECTS OF THE INVENTION

Accordingly, the first object of the present invention is to provide a bandpass filter having excellent attenuation characteristics not only near the passband but also at higher frequencies, a high-frequency device comprising it, and a communications apparatus.

The second object of the present invention is to provide a bandpass filter that can be miniaturized with low loss, a high-frequency device comprising it, and a communications apparatus.

DISCLOSURE OF THE INVENTION

The bandpass filter of the present invention comprises two or more resonators arranged between two input/output terminals in a laminate substrate comprising pluralities of dielectric layers;

each resonator being constituted by a resonance line and a resonance capacitance connected to one end of said resonance line;

capacitance electrodes forming said resonance capacitances and said resonance lines being arranged on different dielectric layers via a planar ground electrode covering the entire structural portion of the bandpass filter, when viewed in a lamination direction; and in each of the resonators connected to said two input/output terminals, the junctions of said input/output terminals to paths between said resonance lines and said resonance capacitances being closer to said resonance capacitances than said resonance lines in a lamination direction.

This structure reduces the length of via-conductors from the input/output terminals to the resonance capacitances, thereby reducing parasitic inductance to the resonance capacitances when viewed from the input/output terminals. The bandpass filter has high attenuation at higher frequencies than the passband, with the resonance capacitances having impedance close to short-circuiting. However, when via-conductors have large parasitic inductance, the resonance capacitances do not have sufficiently short-circuiting impedance at high frequencies. The structure of the present invention suppresses parasitic inductance, providing high attenuation not only near the passband but also at higher frequencies.

In said bandpass filter, the two input/output terminals are preferably connected to said paths on a dielectric layer on which capacitance electrodes for the resonance capacitances are arranged. With this structure, the input/output terminals are directly connected to the resonance capacitances without passing through via-conductors, minimizing the parasitic inductance of via-conductors to the resonance capacitances when viewed from the input/output terminals, thereby providing higher attenuation at higher frequencies.

In said bandpass filter, each resonance line preferably has one end connected to each resonance capacitance through a via-conductor, and the other end connected to said ground electrode through a via-conductor. With this structure, via-conductors function as inductors constituting part of resonance lines, thereby making the resonance lines necessary for resonance shorter, contributing to the miniaturization and loss reduction of the bandpass filter.

Said bandpass filter preferably comprises a coupling capacitance for coupling the resonance lines, both of capacitance electrodes for the resonance capacitances and capacitance electrodes for the coupling capacitance being arranged on different dielectric layers from those on which said resonance lines are formed, via a dielectric layer on which said ground electrode is formed. With this structure, the resonance lines are completely separated from the capacitance electrodes by the ground electrode, reducing parasitic capacitance between the resonance lines and the capacitance electrodes, thereby providing the bandpass filter with wide bandwidth and high attenuation.

In said bandpass filter, both of capacitance electrodes forming the resonance capacitances and capacitance electrodes forming the coupling capacitance are preferably sandwiched by two ground electrodes. With this structure, unnecessary parasitic capacitance other than the coupling capacitance can be separated by the ground electrode, providing the bandpass filter with wider bandwidth and higher attenuation.

In said bandpass filter, said coupling capacitance is preferably constituted by pluralities of opposing capacitance electrodes connected to the resonance lines to be coupled, an opposing portion of one capacitance electrode covering an opposing portion of the other capacitance electrode with a margin when viewed in a lamination direction. The term "covering with a margin" used herein means that both capacitance electrodes are arranged, such that an opposing portion of one capacitance electrode spreads to cover an opposing portion of the other capacitance electrode when viewed in a lamination direction. For example, in the case of rectangular capacitance electrodes, an opposing portion of one capacitance electrode is larger than an opposing portion of the other capacitance electrode in both width and length. With this structure, the opposing area of the capacitance electrodes would not change even if there were the lateral displacement of lamination, suppressing the variation of characteristics.

In said bandpass filter, said resonance lines are preferably arranged in parallel such that adjacent ones are electromagnetically coupled; each resonance line being constituted by serially connecting both ends of plural conductor strip patterns formed on pluralities of layers; and part of these conductor strip patterns being arranged on the same dielectric layers with the remainder on different dielectric layers, such that adjacent resonance lines are arranged with displacement in a lamination direction. Because this structure reduces coupling between different-height, adjacent resonance lines, intervals between the resonance lines can be reduced to miniaturize the bandpass filter. Also, because adjacent resonance lines have small interlayer electromagnetic coupling even if there were the lateral displacement of lamination, the variation of characteristics due to the lateral displacement of lamination can be suppressed.

Said bandpass filter preferably comprises three or more parallel resonance lines displaced in a lamination direction. This structure makes resonance-line-forming conductor strip patterns closer to each other, miniaturizing the bandpass filter. Also, even if there were the lateral displacement of lamination, adjacent resonance lines would have reduced interlayer electromagnetic coupling. Though the resonance lines may be displaced successively in a lamination direction, they are more preferably displaced alternately in a lamination direction to reduce the number of layers necessary for constituting the resonance lines.

Said bandpass filter preferably comprises coupling capacitance for coupling pluralities of resonance lines, said coupling capacitance being constituted by pluralities of opposing capacitance electrodes connected to the resonance lines to be coupled, and pluralities of said capacitance electrodes being formed on different dielectric layers from those on which said resonance lines are formed, via said ground electrode. This structure enables coupling capacitance to be formed with a high freedom of design, without restriction by narrow intervals of the resonance lines.

When said bandpass filter is viewed in a lamination direction, an opposing portion of one capacitance electrode for the coupling capacitance preferably covers an opposing portion of the other capacitance electrode for said coupling capacitance with a margin. With this structure, the lateral displacement of lamination does not change the opposing area of the capacitance electrodes, suppressing the variation of characteristics.

The high-frequency device of the present invention comprises a high-frequency circuit for a communications apparatus, said high-frequency circuit comprising a laminate comprising pluralities of dielectric layers provided with electrode patterns, devices mounted on said laminate, and the above bandpass filter.

The communications apparatus of the present invention comprises the above high-frequency device.

DESCRIPTION OF THE BEST MODE OF THE INVENTION

Each embodiment of the present invention will be explained in detail below referring to the attached drawings without intention of restricting the present invention thereto, and the explanation of each embodiment is applicable to other embodiments unless otherwise mentioned. The bandpass filter of the present invention is a laminate-type bandpass filter constituted by a laminate substrate comprising pluralities of dielectric layers provided with conductor patterns, which comprises two or more resonators between two input/output terminals. Each resonator is constituted, for example, by a resonance line and a resonance capacitance connected to one end of the resonance line.

Figure 1A:
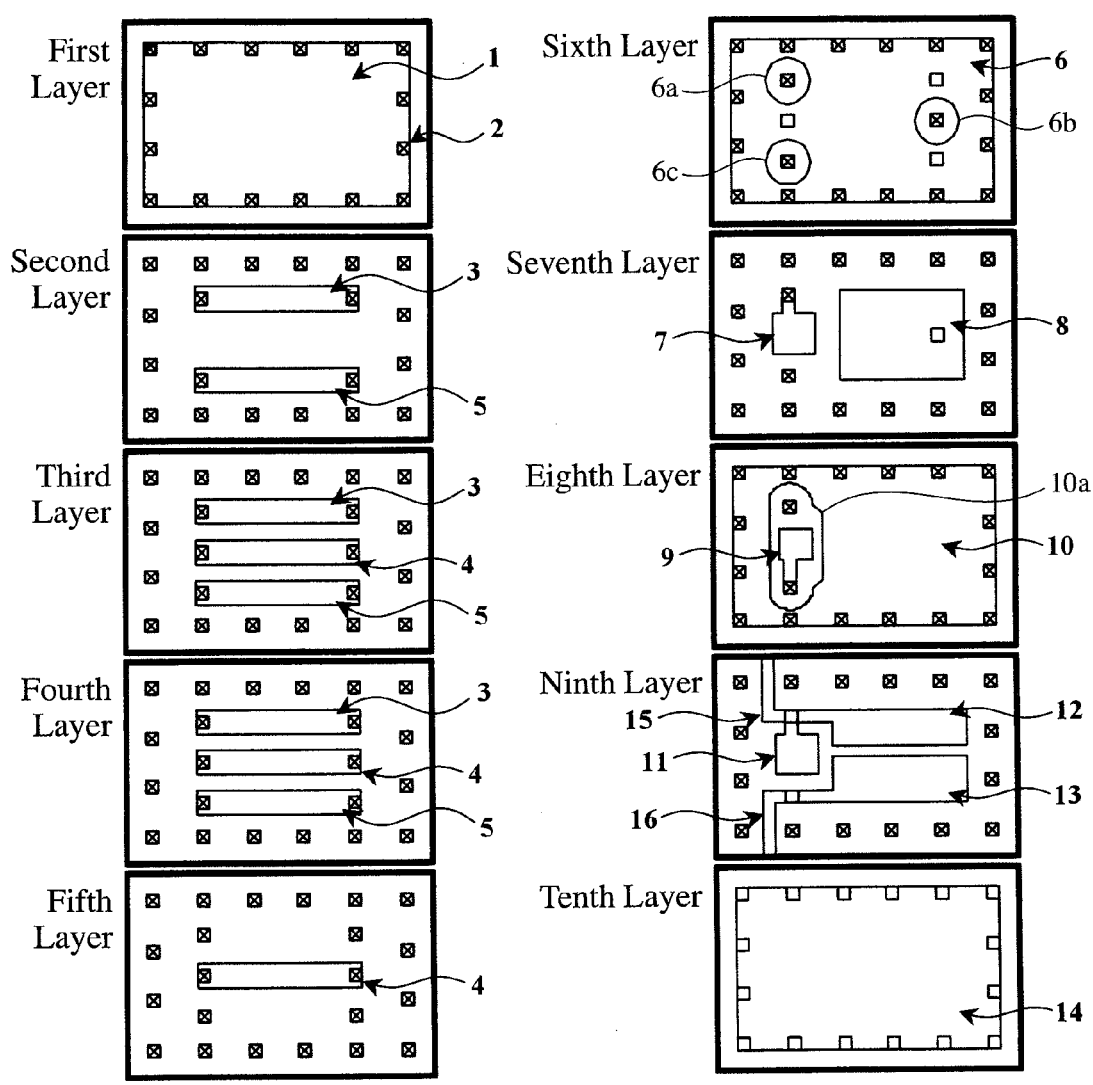
FIG. 1(a) is a development showing conductor patterns in a laminate substrate constituting a bandpass filter according to an embodiment of the present invention.
Figure 2:
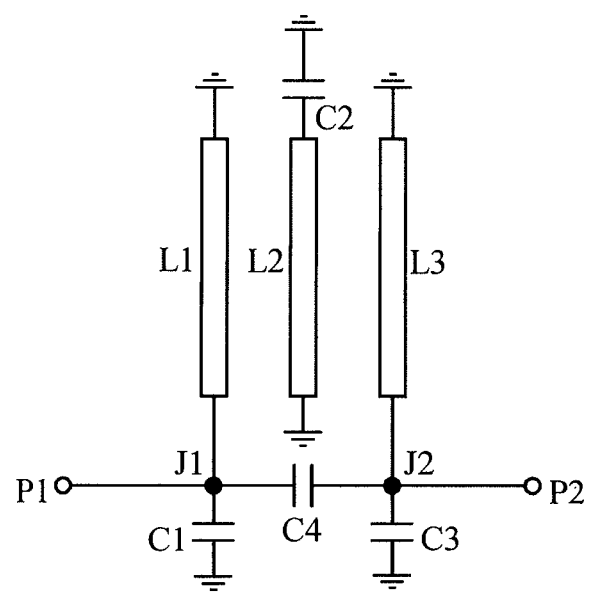
FIG. 2 is a view showing the equivalent circuit of the bandpass filter shown in FIG. 1(a).

FIG. 1(a) shows conductor patterns on each layer constituting a laminate-type bandpass filter according to an embodiment of the present invention, and FIG. 2 shows one example of the equivalent circuits of the bandpass filter shown in FIG. 1(a). This bandpass filter comprises three resonators each constituted by a resonance line and a resonance capacitance. First to third resonance lines L1-L3 are arranged in parallel such that adjacent ones are electromagnetically coupled. Each resonance line, which is an inductance element, has one end connected to each resonance capacitance C1-C3, which is a grounded capacitance, and the other end directly grounded, thereby constituting a resonator. With respect to connection to the resonance capacitance, the connection direction of the second (center) resonance line L2 to the resonance capacitance C2 is opposite to the connection direction of the first and third resonance lines L1, L3 on both sides thereof to the resonance capacitances C1, C3. One input/output terminal P1 is connected to a junction J1 of the first resonance line L1 and the resonance capacitance C1, and the other input/output terminal P2 is connected to a junction J2 of the third resonance line L3 and the resonance capacitance C3. Connected between the junction J1 and the junction J2 is jump capacitance C4 acting to couple the resonance lines L1 and L3. The bandpass filter of the present invention is not restricted to have the equivalent circuit shown in FIG. 2, but may have the other structure. For example, the number of resonance lines is not restricted to three, but may be two or four or more. The directions of the resonance lines are also not restrictive, but all resonance lines may be oriented in the same direction, or only one of three resonance lines at a side end may be oriented in an opposite direction. However, alternately oriented resonance lines provide a higher degree of freedom in the formation of resonance capacitance, advantageous in the miniaturization of the bandpass filter. Input/output capacitance may be connected to each input/output terminal P1, P2, and the coupling capacitance is not restricted to jump capacitance, but may be interstage-coupling capacitance coupling adjacent resonance lines. The structure of resonance lines, resonance capacitance and coupling capacitance may be properly changed depending on characteristics, etc. needed.

The bandpass filter of the present invention shown in FIG. 1(a) comprises 10 dielectric layers. An uppermost (first) layer and a lowermost (tenth) layer are provided with ground electrodes 1, 14, respectively, and sixth and eighth layers are also provided with ground electrodes 6, 10, respectively. Second to fifth layers sandwiched by the first and sixth layers each having a planar ground electrode are provided with conductor strip patterns 3-5 constituting resonance lines functioning as inductance elements, and seventh to ninth layers sandwiched by the sixth and tenth layers each having a planar ground electrode 6, 14 are provided with capacitance electrode patterns. In the figure, small squares with diagonal lines indicate via-conductors, and small squares without diagonal lines indicate portions to which via-conductors are connected. Via-conductors provided in a row along four sides of the ground electrodes 1, 6, 10 formed on the first, sixth and eighth layers are connected to the ground electrode 14 on the tenth layer. Lines of via-conductors completely surround a region in which the bandpass filter is constituted, to suppress interference with the outside. Though not depicted, ground electrodes on inside layers are connected to ground terminals on a top or rear surface through via-conductors, etc.

Each of resonance lines L1-L3 arranged in parallel on pluralities of layers is constituted by serially connecting both ends of plural conductor strip patterns through via-conductors. The parallel arrangement of resonance lines reduces resistance, thereby suppressing insertion loss. Conductor strip patterns 3, 5 forming the first and third resonance lines L1, L3, respectively, are formed on the second to fourth dielectric layers, and a conductor strip pattern 4 forming the second resonance line L2 is formed on the third to fifth layers. Namely, part of plural conductor strip patterns for adjacent resonance lines are arranged on the same dielectric layers (third and fourth layers), and the remaining conductor strip patterns are arranged on different dielectric layers (second and fifth layers). Conductor strip patterns for the first to third resonance lines L1-L3 may have the same shape.

Thus, adjacent resonance lines are arranged with level difference by one layer, and three resonance lines are coupled on the third and fourth layers. Such structure provides weaker electromagnetic coupling than when all conductor strip patterns for the first to third resonance lines L1-L3 are arranged on the same dielectric layers, and makes the conductor strip patterns closer to each other, thereby miniaturizing the bandpass filter. The formation of all conductor strip patterns on different layers rather provides too weak electromagnetic coupling. When the resonance lines are constituted by parallel lines on pluralities of layers, the lateral displacement of lamination of dielectric layers, if any, may cause the electromagnetic coupling of adjacent resonance lines even between conductor strip patterns formed on different dielectric layers, changing the characteristics of the bandpass filter. On the other hand, when adjacent resonance lines are arranged with displacement in a lamination direction as shown in FIG. 1(a), the interlayer electromagnetic coupling of adjacent resonance lines would be reduced even if there were the lateral displacement of lamination. Accordingly, the arrangement of adjacent resonance lines on layers displaced in a lamination direction is advantageous in suppressing the variation of characteristics due to the lateral displacement of lamination.

Figure 1B:
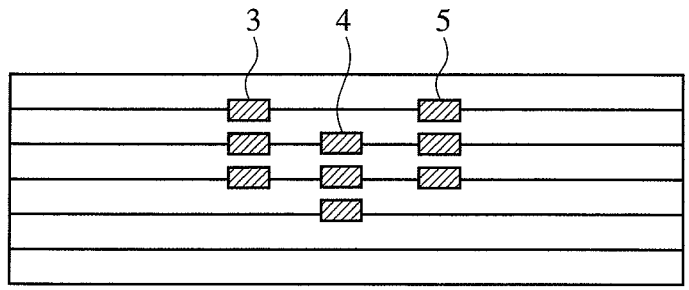
FIG. 1(b) is a cross-sectional view showing the arrangement of conductor strip patterns shown in FIG. 1(a).
Figure 1C:
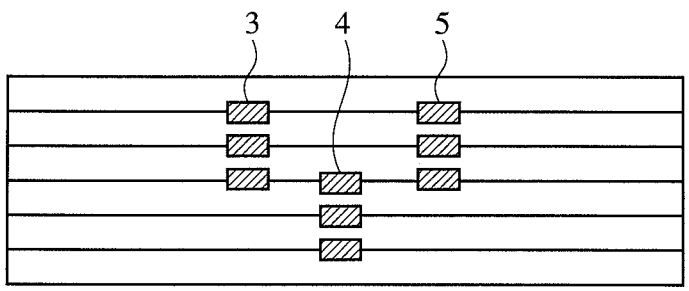
FIG. 1(c) is a cross-sectional view showing one example of the arrangements in which the conductor strip patterns are not alternately displaced in a lamination direction.
Figure 1D:
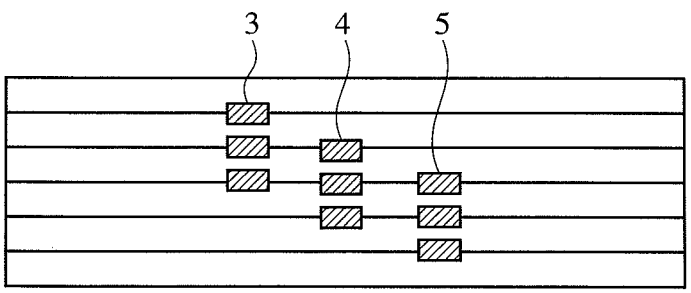
FIG. 1(d) is a cross-sectional view showing another example of the arrangements in which the conductor strip patterns are not alternately displaced in a lamination direction.

If the first, second and third resonance lines were displaced successively in the same lamination direction, the number of dielectric layers would increase. Accordingly, adjacent resonance lines are preferably displaced alternately in a lamination direction, as shown in FIGS. 1(a) and 1(b). In this arrangement, for example, the difference of a resonance-line-carrying level by one layer results in increase in one dielectric layer, suppressing increase in the height of the bandpass filter. As a result, conductor strip patterns can be made closer, miniaturizing the bandpass filter, and even if there were the lateral displacement of lamination, the interlayer electromagnetic coupling of adjacent resonance lines would be reduced. In a case where adjacent resonance lines are alternately displaced in a lamination direction, two-layer level difference needs additional two dielectric layers as shown in FIG. 1(c). In a case where adjacent resonance lines are successively displaced in a lamination direction, two more dielectric layers are needed as shown in FIG. 1(d).

Figure 3:
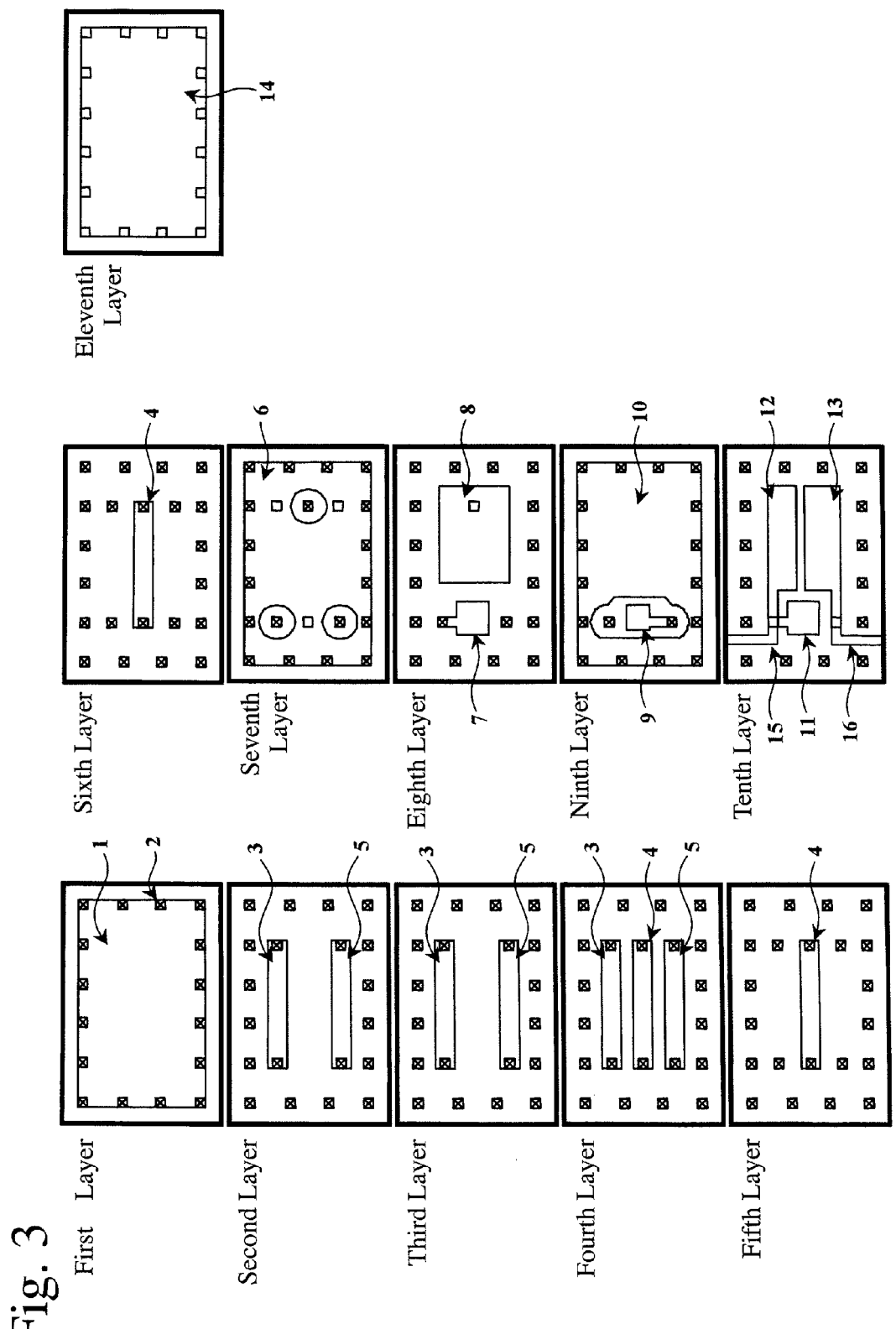
FIG. 3 is a development showing conductor patterns in a laminate substrate constituting a bandpass filter according to a further embodiment of the present invention.

FIG. 3 shows an embodiment in which the arrangement of conductor strip patterns constituting resonance lines is different from that shown in FIG. 1(a). Because other portions than the resonance lines are the same as shown in FIG. 1(a), their explanation will be omitted. In the embodiment shown in FIG. 3, conductor strip patterns 3, 5 constituting the first and third resonance lines L1, L3, respectively, are formed on the second to fourth layers, and a conductor strip pattern 4 constituting the second resonance line L2 is formed on the fourth to sixth layers. Namely, part of plural conductor strip patterns for adjacent resonance lines are arranged on the same dielectric layer (fourth layer), with the remainder on different dielectric layers (second, third, fifth and sixth layers). Such arrangement of adjacent resonance lines with two-layer displacement provides the electromagnetic coupling of three resonance lines only on the fourth layer, reducing the overall electromagnetic coupling of the first to third resonance lines. As a result, the conductor strip patterns can be made closer, miniaturizing the bandpass filter. Because of further reduced influence of the lateral displacement of lamination on the electromagnetic coupling of conductor strip patterns, the variation of characteristics due to the lateral displacement of lamination is advantageously reduced. Incidentally, the conductor strip patterns for the first to third resonance lines L1-L3 may have the same shape.

Figure 4:
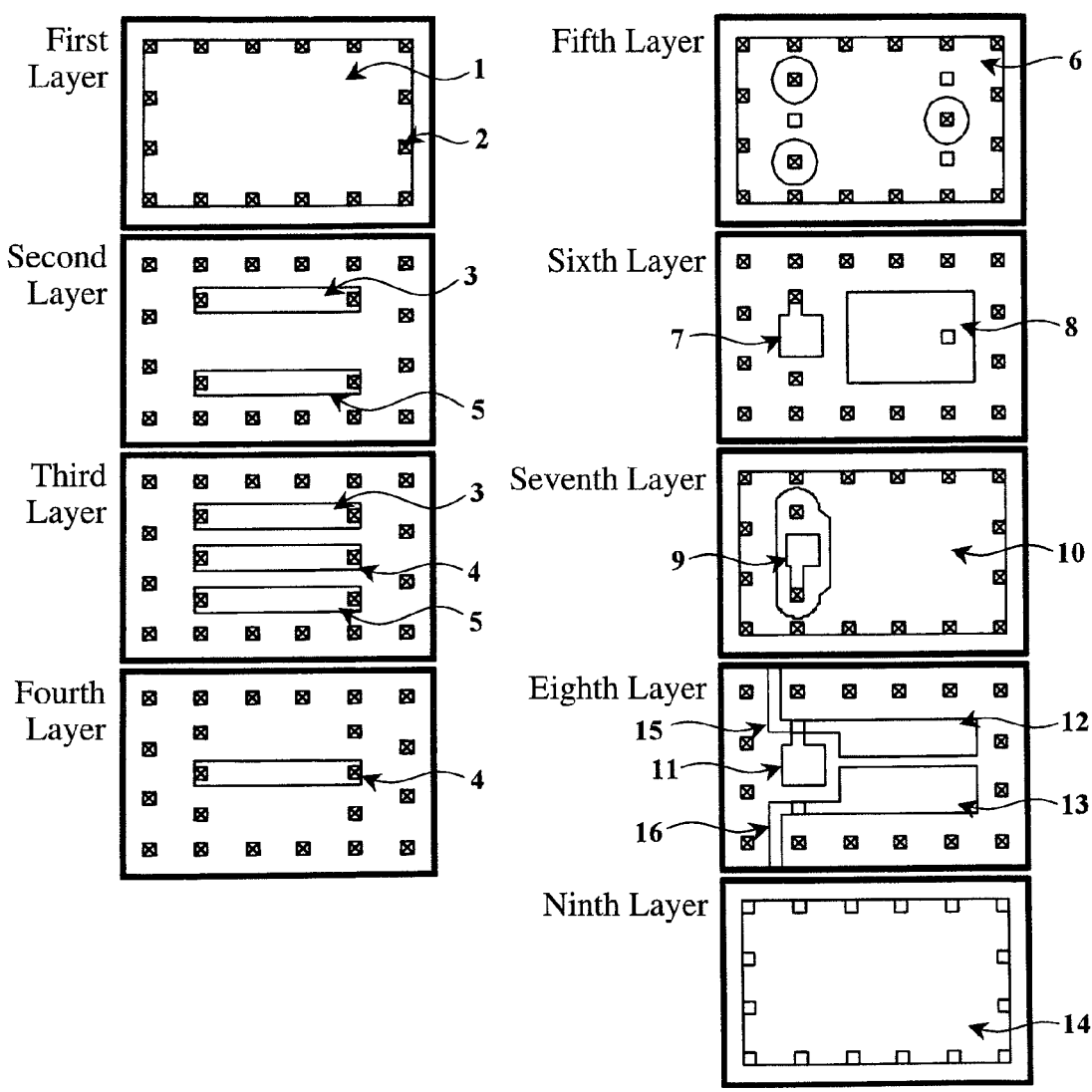
FIG. 4 is a development showing conductor patterns in a laminate substrate constituting a bandpass filter according to a still further embodiment of the present invention.

FIG. 4 shows another embodiment in which the arrangement of conductor strip patterns constituting resonance lines is different from that shown in FIG. 1(a). Because other portions than the resonance lines are the same as shown in FIG. 1(a), their explanation will be omitted. In the embodiment shown in FIG. 4, conductor strip patterns 3, 5 constituting the first and third resonance lines L1, L3, respectively, are formed on the second and third layers, and a conductor strip pattern 4 constituting the second resonance line L2 is formed on the third and fourth layers. Namely, part of plural conductor strip patterns for adjacent resonance lines are arranged on the same dielectric layer (third layer), with the remainder on different dielectric layers (second and fourth layers). While three conductor strip patterns constitute one resonance line in the embodiment shown in FIG. 1(a), two conductor strip patterns constitute one resonance line in the embodiment shown in FIG. 4. The structure shown in FIG. 4 is advantageous in reducing the number of dielectric layers to reduce the height of the bandpass filter. Incidentally, the conductor strip patterns for the first to third resonance lines L1-L3 may have the same shape.

The parallel arrangement of resonance lines with displacement in a lamination direction is advantageous for low loss and miniaturization, though the present invention is not restricted thereto. The resonance lines may be arranged on the same dielectric layer without displacement, and each resonance line may be constituted by one line. However, the parallel arrangement of resonance lines with displacement in a lamination direction can be used widely for the bandpass filters, regardless of the connection positions of input/output terminals and the arrangement of resonance capacitance electrodes. For example, the serial connection of both ends of plural conductor strip patterns formed on pluralities of layers in the laminate substrate can provide a bandpass filter having pluralities of resonance lines whose adjacent ones are electromagnetically coupled, adjacent resonance lines being displaced in a lamination direction, with part of plural conductor strip patterns arranged on the same dielectric layer, with the remainder on different dielectric layers.

Resonance lines and capacitance electrodes are arranged on dielectric layers separated by a planar ground electrode covering the entire structural portion of the bandpass filter. In the embodiment shown in FIG. 1(a), for example, unlike the dielectric layers (second to fourth layers) provided with conductor strip patterns 3-5 for the resonance lines L1-L3, a dielectric layer (sixth layer) having a planar ground electrode 6 exists between the dielectric layers (seventh and ninth layers) provided with capacitance electrodes 8, 12, 13 for the resonance capacitances C2, C1, C3. With the resonance lines and the capacitance electrodes completely separated by a ground electrode, parasitic capacitance is suppressed between the resonance lines and the capacitance electrodes. In FIG. 1, for example, a capacitance electrode 8 formed on the seventh layer to constitute a resonance capacitance C2 connected to the second resonance line L2, which is opposing a ground electrode 6 formed on the sixth layer and a ground electrode 10 formed on the eighth layer, is separated from resonance-line-constituting conductor strip patterns 3-5 formed on the second to fifth layers by the ground electrode 6. The capacitance electrode 8 is connected to one end of the resonance line L2 through a via-conductor.

In the embodiment shown in FIG. 1(a), the capacitance electrode 8 formed on the seventh layer is opposing the ground electrode 6 formed on the sixth layer and the ground electrode 10 formed on the eighth layer to constitute a resonance capacitance C2. One end of the capacitance electrode 8 is connected to one end of the resonance line L2 on an upper layer through via-conductors. The capacitance electrodes 12, 13 formed on the ninth layer are opposing the ground electrode 10 formed on the eighth layer and the ground electrode 14 formed on the tenth layer, to constitute resonance capacitances C1, C3, respectively. One end of each capacitance electrode 12, 13 is connected to one end of each resonance line L1, L3 on an upper layer through via-conductors. The capacitance electrode 7 formed on the seventh layer and the capacitance electrode 11 formed on the ninth layer are connected to one end of the first resonance line L1 through via-conductors. The capacitance electrode 9 formed on the eighth layer is connected to the third resonance line L3 through via-conductors. The other ends (opposite to the ends connected to the resonance capacitance) of the first to third resonance lines L1-L3 are connected to the ground electrode 6 through via-conductors.

The ground electrode 6 is provided with an electrode-free portion (dielectric layer) 6a around a via-conductor connecting the resonance line L1 and the resonance capacitance electrode 12, an electrode-free portion (dielectric layer) 6b around a via-conductor connecting the resonance line L2 and the resonance capacitance electrode 8, and an electrode-free portion (dielectric layer) 6c around a via-conductor connecting the resonance line L3 and the resonance capacitance electrode 13. Because the electrode-free portion 6b is positioned inside an outer periphery of the capacitance electrode 8, the variation of capacitance constituted by the capacitance electrode 8 and the ground electrode 6 is suppressed even when there is the lateral displacement of lamination.

Because the via-conductors connecting the resonance lines and the resonance capacitances, and the via-conductors connecting the resonance lines and the ground electrodes function as inductors, constituting resonance inductors integrally with the resonance lines, the length of lines necessary for resonance can be reduced, providing the bandpass filter with a smaller size and lower loss. The degree of coupling of adjacent resonators can be adjusted by adjacent and opposing via-conductors. In this case, the intervals of via-conductors connected to adjacent linear conductor strip patterns are preferably equal to or smaller than those of the conductor strip patterns. The ground electrode 6 closest to the resonance lines among those on the side of the rear surface (mounting surface) of the laminate substrate acts to reduce parasitic capacitance between the resonance lines and the resonance capacitances as described above. The ground electrode 6 is connected to the ground 14 on the rear surface through pluralities of via-conductors. The other ends of the first to third resonance lines L1-L3 are connected to the ground electrode 6 through via-conductors for stable grounding. The via-conductors are not only used as inductors, but also connected to a lower ground electrode farther than a surface on which amplifying circuits are mounted, thereby reducing parasitic inductance.

One end of each capacitance electrode 12, 13 is connected to each input/output terminal P1, P2 via a connecting line 15, 16. The planar ground electrode 10 covers the entire structural portion of the bandpass filter except for an electrode-free portion (dielectric layer) 10a for forming the capacitance electrode 9. With a dielectric layer shared by the ground electrode 10 for forming the grounded capacitance and the capacitance electrode 9 for forming the coupling capacitance C4, the bandpass filter is miniaturized. The electrode-free portion 10a is formed like an island in the ground electrode 10. The capacitance electrodes 12, 13 have smaller width in portions crossing the electrode-free portion 10a.

The capacitance electrodes 7 and 11 connected to the first resonance line L1 are opposing the capacitance electrode 9 connected to the third resonance line L3, to form jump capacitance C4 coupling the first resonance line L1 and the third resonance line L3. Because a resonance line and a capacitance electrode need not be opposing to form coupling capacitance, the coupling capacitance can be easily formed even with narrow intervals between the resonance lines. Such coupling capacitance is not restricted to the jump capacitance shown in FIG. 1(a), but may be interstage-coupling capacitance for coupling adjacent resonance lines.

As described above, dielectric layers (seventh and ninth layers) having capacitance electrodes 8, 12, 13 constituting the resonance capacitances C1, C3 are different from dielectric layers (second to fourth layers) having conductor strip patterns 3-5 constituting the resonance lines L1-L3. Resonators (L1/C1, L3/C3) connected to the input/output terminals P1, P2 via connecting lines 15, 16 have the following structures. In the embodiment shown in FIG. 1(a), a path between the resonance line L1 (L3) and the resonance capacitance C1 (C3) is mainly constituted by via-conductors formed in the fourth to eighth layers, and two input/output terminals P1, P2 are connected to these paths via the connecting lines 15, 16. Thus, two input/output terminals P1, P2 are connected to the above paths on the dielectric layers on which capacitance electrodes 12, 13 constituting the resonance capacitances C1, C3 are arranged. Because the via-conductors have inductance, the via-conductors are arranged on the resonance line side than the junctions J1, J2 of the input/output terminal P1, P2 [corresponding to the junctions of the via-conductors on the eighth layer and the electrodes on the ninth layer in FIG. 1(a)], making the inductance component of the via-conductors integral with the resonance lines as inductors, and preventing the inductance component from being added to the resonance capacitance. This suppresses unnecessary resonance on the high-frequency side. In the bandpass filter, the impedance of the resonance capacitance is on the short-circuiting side at a higher frequency than the passband, resulting in high attenuation, but it is not sufficiently short-circuiting at a high frequency when the via-conductors have large parasitic inductance. This problem can be solved by suppressing parasitic inductance by the structure shown in FIG. 1(a), thereby obtaining high attenuation on the high-frequency side.

The junctions J1, J2 of the via-conductors constituting paths between the resonance lines and the resonance capacitances and the input/output terminals P1, P2 are preferably formed on the dielectric layer (ninth layer) on which resonance-capacitance-forming electrodes are arranged as shown in FIG. 1(a). However, the effect of obtaining high attenuation can be obtained without using the structure shown in FIG. 1(a), as long as the junctions J1, J2 are positioned closer to the resonance capacitances than the resonance lines in a lamination direction. For example, the junctions J1, J2 may be formed on the seventh or eighth layer on the capacitance electrode side than the ground electrode 6. Accordingly, The term "closer to the resonance capacitances than the resonance lines" includes a case where the junctions J1, J2 are formed on the same dielectric layers as those on which the resonance capacitances are formed. Such arrangement suppresses the parasitic inductor of the input/output terminals P1, P2 and the resonance capacitances, thereby obtaining high attenuation not only near the passband but also on the higher-frequency side.

In the case of a high-frequency device comprising only bandpass filters, the connecting lines 15, 16 are led to side surfaces or a rear surface (mounting surface) through via-conductors, so that they are connected to two input/output terminals P1, P2. On the other hand, in the case of a composite, high-frequency device comprising bandpass filters and other circuit devices, at least one of two input/output terminals P1, P2 connected to the connecting lines 15, 16 is connected to the other circuit devices. When via-conductors connected to the other circuit devices share the same layers with the bandpass filters, the connecting via-conductors are arranged outside lines of via-conductors formed along four sides of the ground electrode, to suppress unnecessary interference with the bandpass filters.

In the embodiment shown in FIG. 1(a), the capacitance electrodes 7, 9 and 11 constituting the coupling capacitance C4 are arranged on the seventh to ninth layers different from the second to fifth layers on which the conductor strip patterns 3-5 constituting resonance lines are formed, with the ground electrode 6 between the capacitance electrodes 7, 9 and 11 and the conductor strip patterns 3-5. Likewise, the capacitance electrodes 8, 12 and 13 constituting the resonance capacitances C1-C3 are arranged on the seventh and ninth layers different from those on which the conductor strip patterns 3-5 are formed, with the ground electrode 6 disposed therebetween. Such arrangement of resonance lines on one side (upper side) and all capacitance electrodes (resonance capacitances, coupling capacitance, etc.) on the other side (lower side) with the ground electrode sandwiched thereby provides reduced parasitic capacitance. The coupling capacitance is not restricted to jump capacitance, but may be interstage-coupling capacitance between adjacent resonance lines, or both. A dielectric layer having a ground electrode need only be arranged between the capacitance electrodes and the resonance lines, but further reduction of parasitic capacitance can be achieved by providing the tenth layer with a ground electrode, so that the capacitance electrodes are sandwiched by two ground electrodes as shown in FIG. 1(a).

Because an opposing portion (rectangular portion excluding a strip portion used for connection with via-conductors, etc.) of the capacitance electrode 9 formed on the eighth layer is smaller the opposing portions (rectangular portions excluding strip portions used for connection with via-conductors, etc.) of the capacitance electrodes 7, 11 formed on the seventh and ninth layers, respectively, the entire opposing portion of the capacitance electrode 9 is completely sandwiched by the opposing portions of the capacitance electrodes 7, 11. With the opposing portion of one capacitance electrode arranged inside the opposing portions of the other capacitance electrodes, capacitance variation would be suppressed even if there were the lateral displacement of lamination.

In the ground electrode 6 formed on the sixth layer, electrode-free portions 6a, 6c are formed around the via-conductors connected to the capacitance electrodes 7, 9. Because portions of the capacitance electrodes 7, 9 crossing the electrode-free portions 6a, 6c are thinner than their opposing portions, the variation of characteristics would be suppressed even if there were the lateral displacement of lamination. The entire capacitance-forming portions of the capacitance electrodes 7, 9 overlap the ground electrode 6.

Figure 5A:
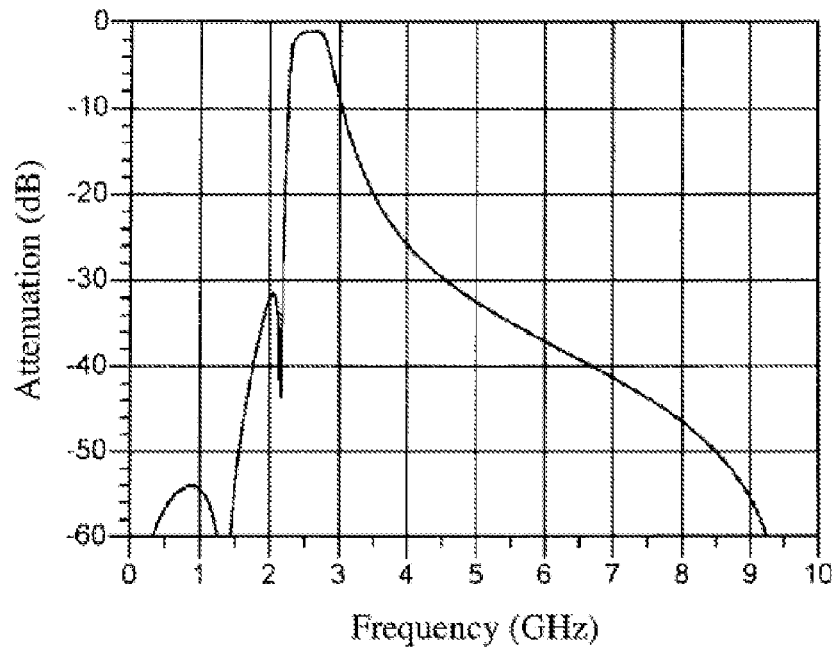
FIG. 5(a) is a graph showing the attenuation characteristics of the bandpass filter shown in FIG. 1(a).
Figure 5B:
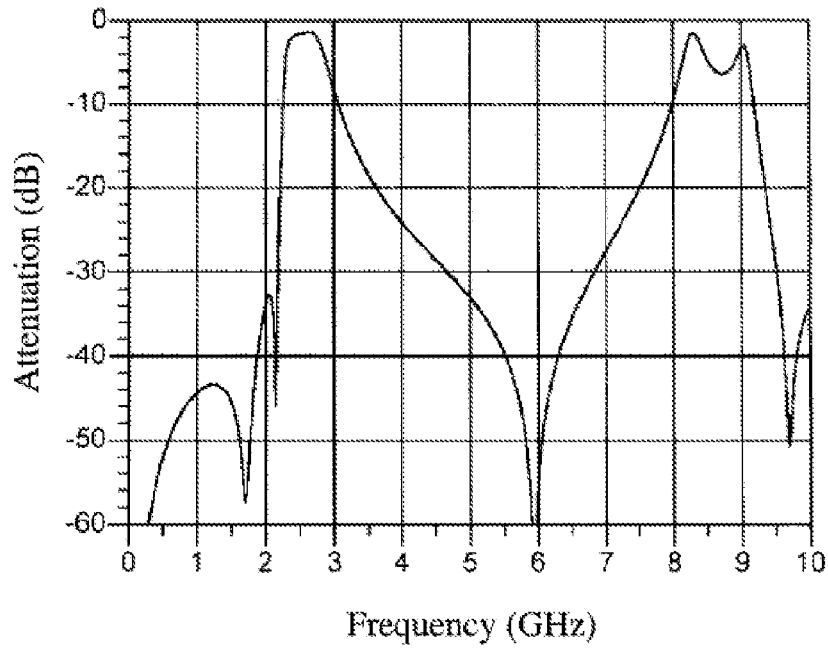
FIG. 5(b) is a graph showing the attenuation characteristics of a conventional bandpass filter.

FIG. 5 (*a*) shows the attenuation characteristics of the bandpass filter according to the embodiment shown in FIG. 1(*a*), and FIG. 5 (*b*) shows the attenuation characteristics of a conventional bandpass filter having the connecting positions of input/output terminals on the side of resonance lines. Both bandpass filters have a 2.4-GHz passband. As shown in FIG. 5 (*b*), the conventional bandpass filter has smaller attenuation in frequencies higher than the passband (near third harmonics), failing to sufficiently block unnecessary signals on the high-frequency side. On the other hand, the bandpass filter of the present invention has large attenuation in high-frequency bands as shown in FIG. 5 (*a*), exhibiting excellent attenuation characteristics in high-frequency bands.

Figure 6:
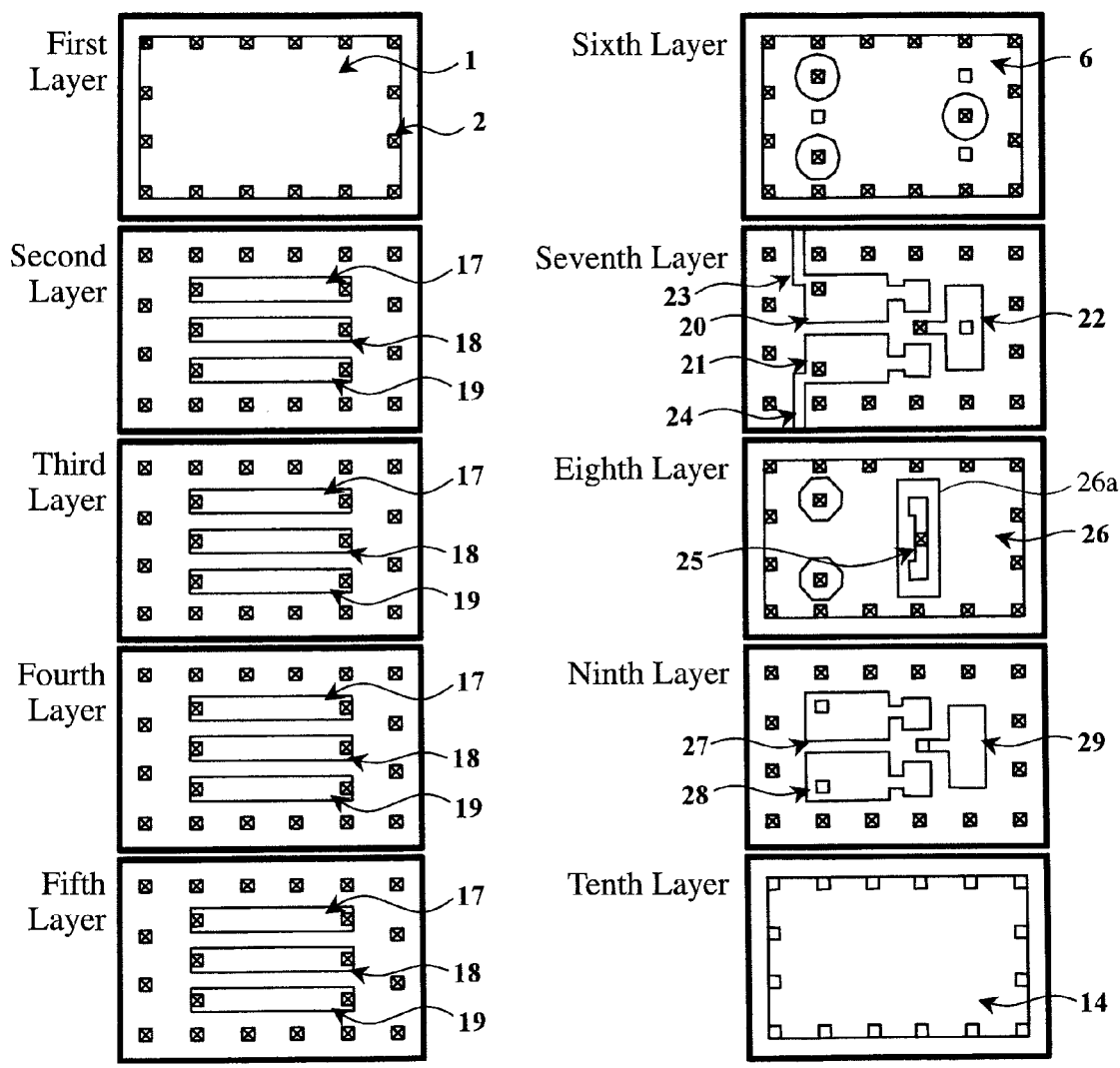
FIG. 6 is a development showing conductor patterns in a laminate substrate constituting a bandpass filter according to a still further embodiment of the present invention.
Figure 7:
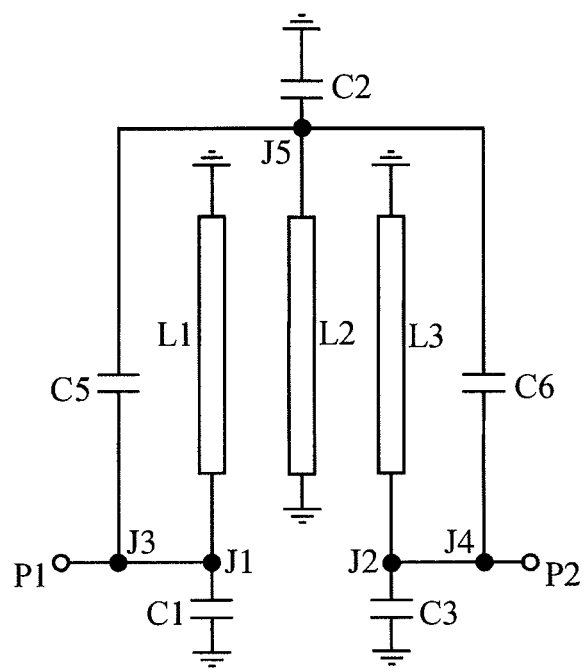
FIG. 7 is a view showing the equivalent circuit of the bandpass filter shown in FIG. 6.

FIG. 6 shows conductor patterns on layers in the bandpass filter according to another embodiment of the present invention, and FIG. 7 shows the equivalent circuit of the bandpass filter of FIG. 6. The same reference numerals are given to the same parts as in FIG. 1(*a*), and the explanation of portions shared with the embodiment shown in FIG. 1(*a*) will be omitted. In the embodiment shown in FIG. 6, conductor strip patterns 17-19 constituting the first to third resonance lines L1-L3 are formed on the second to fifth layers. Each resonance line is constituted by four conductor strip patterns, and all conductor strip patterns are arranged on the same dielectric layers to suppress increase in the number of dielectric layers while achieving low loss. As in the embodiment shown in FIG. 1(*a*), the bandpass filter is constituted by 10 dielectric layers.

The equivalent circuit shown in FIG. 7 is different from the equivalent circuit shown in FIG. 2 with respect to the arrangement of capacitance electrodes including coupling capacitance. In the equivalent circuit shown in FIG. 7, coupling capacitances C5, C6 are disposed between junctions J3, J4 (between the junctions J1, J2 of paths between resonance lines L1, L3 and resonance capacitances C1, C3, and input/output terminals P1, P2), and a junction J5 on a path between a center resonance line L2 and a resonance capacitance C2. Thus, adjacent resonators are coupled via interstage-coupling capacitance. With such difference of capacitance, conductor patterns on the seventh to ninth layers are different from those shown in FIG. 1(*a*).

Capacitance electrodes 20-22 are formed on the seventh layer on the opposite side to the resonance lines L1-L3 in a lamination direction with respect to the ground electrode 6, and one end of each capacitance electrode 20, 21 is connected to each input/output terminal P1, P2 via a connecting line 23, 24. On the ninth layer, capacitance electrodes 27-29 having the same shapes as those of the capacitance electrodes 20-22 except for connecting lines are formed. Each capacitance electrode 20-22 is connected to each capacitance electrode 27-29 through via-conductors, and opposing the ground electrode 6 formed on the sixth layer, the ground electrode 26 formed on the eighth layer, and the ground electrode 14 formed on the tenth layer to form resonance capacitances C1-C3.

A strip-shaped capacitance electrode 25 is formed in a rectangular electrode-free portion 26a disposed in the ground electrode 26, and a center portion of the capacitance electrode 25 is connected to capacitance electrodes 22, 29 through via-conductors. The capacitance electrode 25 extends perpendicularly to the resonance lines, with its one end opposing part of the capacitance electrodes 20 and 27 and the other end opposing part of the capacitance electrodes 21 and 28, to form interstage-coupling capacitances C5, C6, respectively. Each capacitance electrode 20, 21, 27 and 28 comprises a portion opposing the ground electrode 26 to form the grounded capacitance, a portion opposing the capacitance electrode 25 to form coupling capacitance, and a thin connecting portion between the grounded-capacitance-forming portion and the coupling-capacitance-forming portion. The thin connecting portion crosses a boundary between the ground electrode 26 and the electrode-free portion 26a. With such structure, the variation of characteristics would be suppressed even if there were the lateral displacement of lamination. Because the coupling-capacitance-forming electrode 25 is arranged in the electrode-free portion 26a, the ground electrode forming the grounded capacitance and the capacitance electrode forming the coupling capacitance are formed on the same dielectric layer, miniaturizing the bandpass filter.

In the embodiment shown in FIG. 6, paths between the resonance lines L1, L3 and the resonance capacitances C1, C3 are constituted by via-conductors mainly formed on the fifth and sixth layers, and connected to the two input/output terminals P1, P2 via the connecting lines 23, 24 on the seventh layer. Their junctions J1, J2 correspond to the connecting points of the connecting lines 23, 24 and the capacitance electrodes 20, 21. In this embodiment, too, two input/output terminals P1, P2 are connected to paths between the resonance lines L1, L3 and the resonance capacitances C1, C3, on a dielectric layer on which the capacitance electrodes 20, 21 forming the resonance capacitance C1, C3 are arranged. Thus, the junctions J1, J2 are positioned closer to the resonance capacitances than the resonance lines. Of course, the term "closer to the resonance capacitances than the resonance lines" includes a case where the junctions J1, J2 and the resonance capacitances exist on the same dielectric layer.

Rectangular opposing portions at both ends of the capacitance electrode 25 are smaller than those of the capacitance electrodes 20, 21, 27 and 28, so that the former are completely covered by the latter with margin. Namely, an opposing portion of the capacitance electrode 25 is included in an opposing portion of each capacitance electrode 20, 21, 27 and 28 when viewed in a lamination direction. Thus, by arranging an opposing portion of one capacitance electrode inside an opposing portion of the other capacitance electrode when viewed in a lamination direction, capacitance variation would be suppressed even if there were the lateral displacement of lamination.

Figure 8:
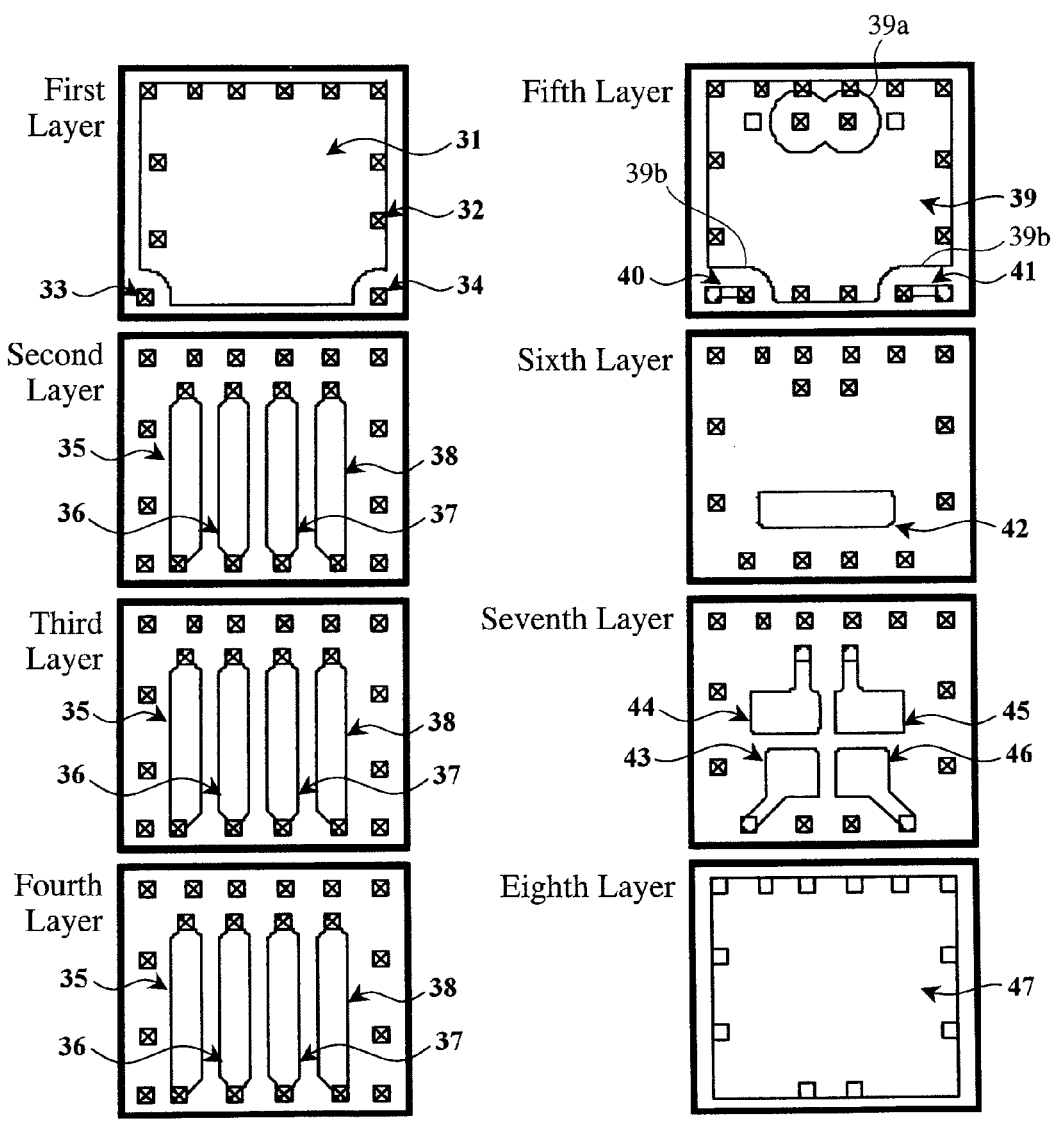
FIG. 8 is a development showing conductor patterns in a laminate substrate constituting a bandpass filter according to a still further embodiment of the present invention.
Figure 9:
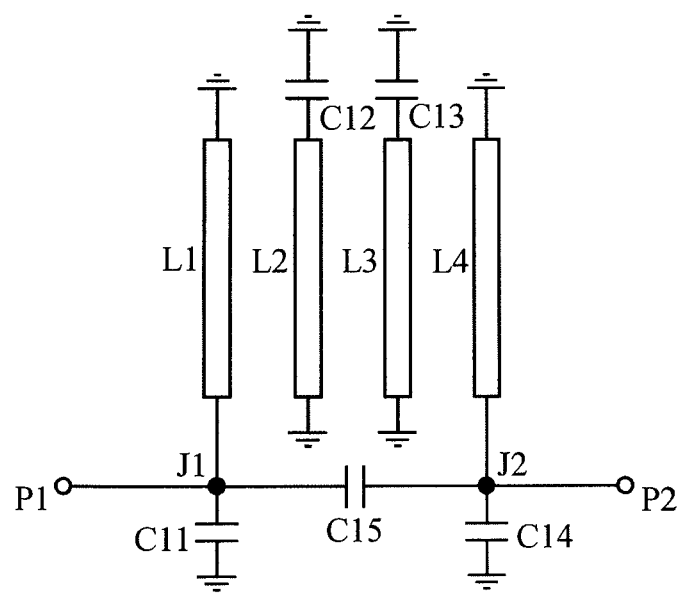
FIG. 9 is a view showing the equivalent circuit of the bandpass filter shown in FIG. 8.

FIG. 8 shows a further example of laminate-type bandpass filters, in which two input/output terminals are connected to paths between resonance lines and resonance capacitances at positions closer to the resonance capacitances than the resonance lines in a lamination direction, and FIG. 9 shows the equivalent circuit of the laminate-type bandpass filter shown in FIG. 8. With respect to the same structures and functions as above, explanation will be omitted. This laminate-type bandpass filter comprises four resonators between two input/output terminals, exhibiting excellent filtering characteristics. First to fourth resonance lines L1-L4 are arranged in parallel such that adjacent ones are electromagnetically coupled. Each resonance line as an inductance element has one end connected to each resonance capacitance C11-C14 as a grounded capacitance, and the other end directly grounded, thereby constituting a resonator. Each end of two outside resonance lines L1 and L4 on one longitudinal side (lower side in the figure) is connected to a resonance capacitance C11, C14, and each end of two inside resonance lines L2, L3 on the other longitudinal side (upper side in the figure) is connected to a resonance capacitance C12, C13. Thus, the two outside resonance lines L1 and L4 and the two inside resonance lines L2 and L3 are opposite to each other with respect to the connection direction to the resonance capacitances. This structure provides a high degree of freedom of arranging the resonance capacitances. A junction J1 of the first resonance line L1 and the resonance capacitance C11 is connected to one input/output terminal P1, and a junction J2 of the fourth resonance line L4 and the resonance capacitance C14 is connected to the other input/output terminal P2. Connected between the junction J1 and the junction J2 is a jump capacitance C15 as a capacitance for coupling the resonance line L1 and the resonance line L4.

The bandpass filter shown in FIG. 8 comprises eight dielectric layers. A first layer (uppermost layer), a fifth layer, and an eighth layer (lowermost layer) are provided with planar ground electrodes 31, 39 and 47, respectively. The second to fourth layers sandwiched by the ground electrodes 31 and 39 are provided with conductor strip patterns for resonance lines, and the sixth and seventh layers sandwiched by the ground electrodes 39 and 47 are provided with capacitance electrode patterns. Namely, arranged on one side in a lamination direction with respect to the ground electrode 39 are the resonance lines, and the other side the capacitance electrodes. With the resonance lines and the capacitance electrodes completely separated by the ground electrode, parasitic capacitance is reduced between them, providing the bandpass filter with wider bandwidth and higher attenuation.

For loss reduction, each resonance line L1-L4 is constituted by serially connecting both ends of plural conductor strip patterns formed on pluralities of layers (second to fourth layers) through via-conductors. The conductor strip patterns formed on the layers have the same shape. Both end portions of each conductor strip pattern are tapered toward the connecting via-conductors. Both end portions of the inside conductor strip patterns 36, 37 extend along a transverse centerline, and both end portions of the conductor strip patterns 35, 38 are biased outward in a parallel direction. Each end of the conductor strip patterns 35-38 is connected to a via-conductor. This structure contributes to the miniaturization of lines connected to via-conductors.

Capacitance electrodes 43-46 are formed on the seventh layer on the opposite side in a lamination direction to the resonance lines with respect to a planar ground electrode 39 on the fifth layer, and opposing the ground electrode 39 on the fifth layer and a ground electrode 47 on the eighth layer to constitute resonance capacitances C11-C14 connected to the first to fourth resonance lines L1-L4. Each capacitance electrode 43-46 comprises a rectangular portion opposing the ground electrode to form capacitance, and a narrow portion connected to a via-conductor. With the outside and inside resonators oriented in opposite directions, the rectangular portions of the capacitance electrodes 43-46 are arranged in tow rows longitudinally and transversely. With this structure, the capacitance electrodes 43-46 are arranged inside a region in which the conductor strip patterns 35-38 are formed, miniaturizing the bandpass filter.

For miniaturization, the capacitance electrodes 43-46 and the conductor strip patterns 35-38 for resonance lines are arranged on different dielectric layers and connected through via-conductors. By forming all resonance capacitance electrodes on the same dielectric layer, the number of layers in the laminate substrate decreases to reduce the height and cost of the bandpass filter.

A planar ground electrode 39 covers the entire structural portion of the bandpass filter except for portions around via-conductors connecting the resonance lines and the resonance capacitances. The ground electrode 39 comprises an insulating electrode-free portion 39a disposed around via-conductors connecting the inside conductor strip patterns 36, 37 and the capacitance electrodes 44, 45, and notch portions 39b disposed around via-conductors connecting the outside conductor strip patterns 35, 38 and the capacitance electrodes 43, 46.

The sixth layer is provided with a rectangular capacitance electrode 42 forming coupling capacitance. Both longitudinal ends of the capacitance electrode 42 are opposing the capacitance electrodes 43, 46, constituting a jump capacitance C15 coupling the first resonance line L1 and the fourth resonance line L4. Thus, with pluralities of capacitance electrodes, which are formed on a different dielectric layer from those having resonance lines and connected to the resonance lines to be coupled, opposing an additional capacitance electrode formed on a further different dielectric layer, a coupling capacitance of plural resonance lines is formed. Because the resonance lines and the capacitance electrodes need not be opposing for coupling capacitance, coupling capacitance can be easily formed even with narrow intervals between the resonance lines. Further, because the outside resonators are oriented in the same direction, jump capacitance is more easily arranged between the input and the output than when the resonators are oriented alternately. As a result, unnecessary parasitic capacitance is reduced, providing the bandpass filter with wider bandwidth and high attenuation.

Because the coupling-capacitance-forming electrode 42 is formed on the opposite side to the resonance lines with respect to the ground electrode 39 (on the same side as the resonance capacitances), they are completely separated from the resonance lines by the ground electrode. The capacitance electrode 42 is so long that both longitudinal ends thereof are positioned outside the capacitance electrodes 43, 46, and so narrow that both transverse ends thereof are positioned inside the capacitance electrodes 43, 46. With this structure, the variation of characteristics would be suppressed even if there were the lateral displacement of lamination. The coupling capacitance is not restricted to the jump capacitance shown in FIG. 8, but may be an interstage-coupling capacitance of adjacent resonance lines.

Connecting lines 40 and 41 are connected to via-conductors (connecting each capacitance electrode 43, 46 and one end of each conductor strip pattern 35, 38) formed on the fifth layer, and connected to the input/output terminals P1, P2 through via-conductors 33, 34 exposed on the first layer. In FIG. 8, a path between the resonance line L1 (L4) and the resonance capacitance C11 (C14) is mainly constituted by via-conductors formed in the fourth to sixth layers, and connected to two input/output terminals P1, P2 via the connecting lines 40, 41 formed on the fifth layer. The thickness of the fourth layer on which conductor strip patterns are formed is larger than the total thickness of the fifth and sixth layers, such that the distance between the junctions of the connecting lines 40, 41 and via-conductors and the capacitance electrodes is smaller than the distance between the junctions and the conductor strip patterns. With such structure, two input/output terminals are connected to the paths between the resonance lines and the resonance capacitances at positions closer to the resonance capacitances than the resonance lines in a lamination direction, in the embodiment shown in FIG. 8, too. In one example having the structure shown in FIG. 8, the distance between the junction (connecting point of two input/output terminals) of the connecting lines 40, 41 and the via-conductors and the resonance capacitances is 30 µm, and the distance between the junction and the resonance lines is 200 µm. The distance between the junction (connecting point of two input/output terminals) of the connecting lines 40, 41 and the via-conductors and the resonance capacitances is preferably ⅓ or less of the distance between the junction and the resonance lines. The distance between the junction (connecting point of two input/output terminals) of the connecting lines 40, 41 and the via-conductors and the resonance capacitances is preferably 100 μm or less.

Figure 10:
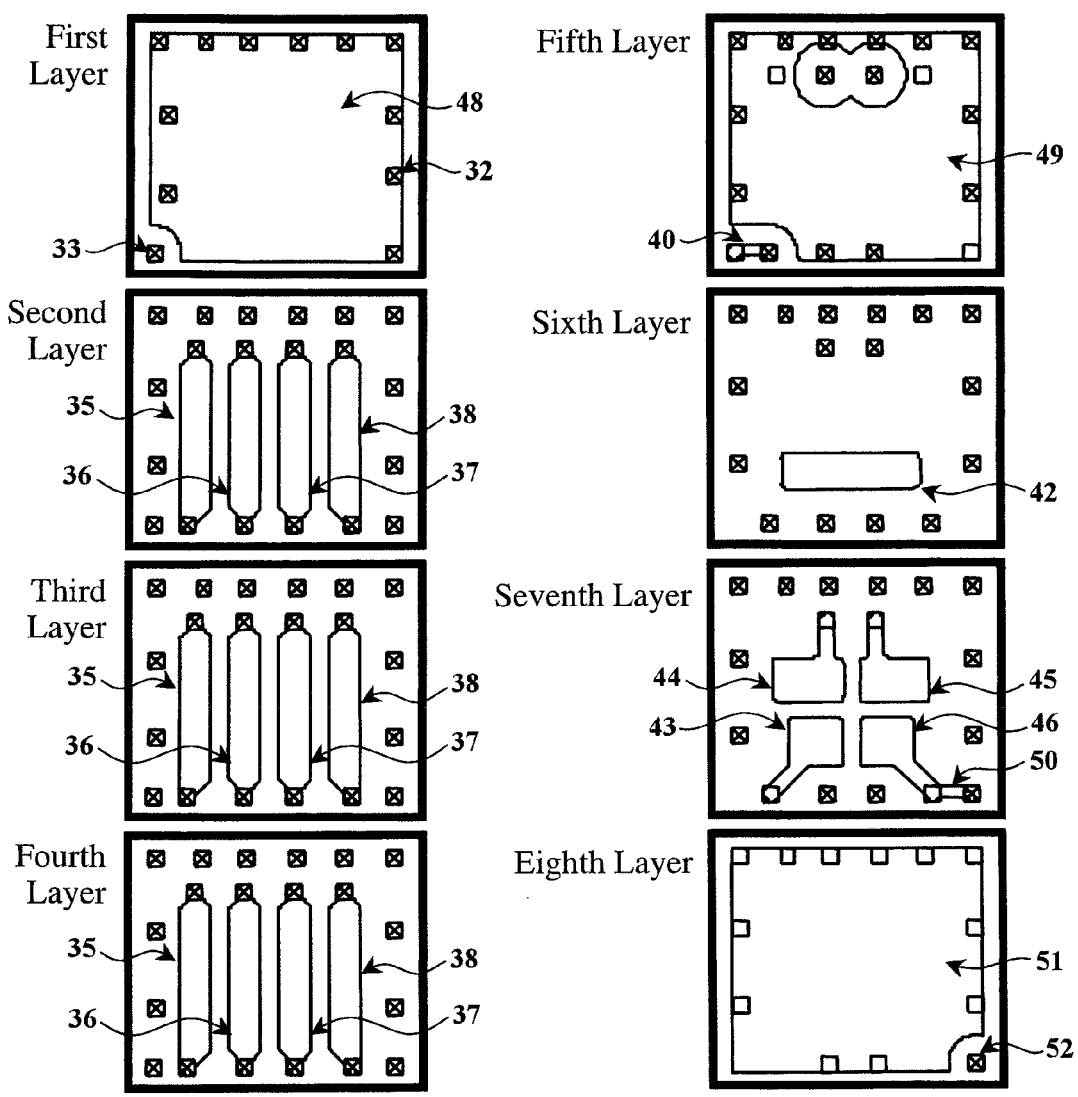
FIG. 10 is a development showing conductor patterns in a laminate substrate constituting a bandpass filter according to a still further embodiment of the present invention.

FIG. 10 shows another example of bandpass filters, in which two input/output terminals are connected to a path between resonance lines and resonance capacitances at position closer to the resonance capacitances than the resonance lines in a lamination direction. This bandpass filter has the same equivalent circuit as shown in FIG. 9. Providing the same portions as shown in FIG. 8 with the same reference numerals, their explanation will be omitted. The difference from the structure shown in FIG. 8 is a connecting position to the input/output terminal. Although an input/output terminal P1 connected to the conductor strip pattern 35 is the same as in the embodiment shown in FIG. 8, a conductor strip pattern 38 is connected to an input/output terminal P2 through a connecting line 50 formed on the seventh layer and a via-conductor 52. Although the connecting line 40 of the input/output terminal P1 has the same structure as shown in FIG. 8, the connecting line 50 of the input/output terminal P2 is formed on the same layer as the capacitance electrode 46. In the embodiment shown in FIG. 10, too, the input/output terminals P1, P2 are connected to paths between resonance lines and resonance capacitances at positions closer to the resonance capacitances than the resonance lines. Because the input/output terminals P1, P2 are separately disposed on both sides in a lamination direction in FIG. 10, the connecting structure can be simplified when the bandpass filter is arranged between circuit elements displaced in a lamination direction. Also, the same connecting line as the connecting line 50 may be formed on the seventh layer on the side of the capacitance electrode 43, so that both junctions to the input/output terminals are arranged on the seventh layer. Further, the effect of the present invention can be achieved to some extent, even when only one input/output terminal is connected to a path between the resonance line and the resonance capacitance at a position closer to the capacitance electrode than the resonance line in a lamination direction in the structure shown in FIG. 10.

The above structure can widely be applied to four-stage bandpass filters regardless of the connecting structure of input/output terminals, etc. For example, it provides a bandpass filter comprising four resonators arranged between two input/output terminals in the laminate substrate having pluralities of dielectric layers, each resonator being constituted by a resonance line and a resonance capacitance connected to one end of the resonance line, four resonance lines being arranged in parallel in a planar direction of the dielectric layer, one end of each outside resonance line and the other end of each inside resonance line being respectively connected to resonance capacitances, and capacitance electrodes and resonance lines constituting resonance capacitances being arranged on different dielectric layers. In multiband communications using close frequency bands, steep filtering characteristics not achieved by conventional bandpass filters are needed while meeting the requirement of miniaturization, and the above four-stage bandpass filter can meet such requirement.

The bandpass filter of the present invention may be a single part, but may be used as a high-frequency device combined with a high-frequency circuit. For example, the bandpass filter of the present invention may be assembled in a high-frequency device for a communications apparatus, which comprises a laminate comprising pluralities of dielectric layers provided with electrode patterns, and devices such as semiconductor devices, inductors, etc. mounted on the laminate. In this case, in FIG. 1(*a*), for example, chip devices are mounted on the first layer, external electrode terminals, etc. are disposed on the tenth layer, and a ground electrode arranged immediately below semiconductor devices is separate from a ground electrode connected to the resonance capacitances and the resonance lines of the bandpass filter, to achieve high isolation between the semiconductor devices and the bandpass filters.

The high-frequency devices include, for example, antenna switch modules for switching transmission and reception in wireless communications such as wireless LAN, etc., composite modules integrally comprising antenna switch modules and high-frequency amplifier modules, etc. Such high-frequency device comprises, for example, at least one antenna terminal, at least one transmitting terminal, at least one receiving terminal, and at least one switch circuit for switching the connection of the antenna terminal to the transmitting terminal and the connection of the antenna terminal to the receiving terminal.

Figure 11:
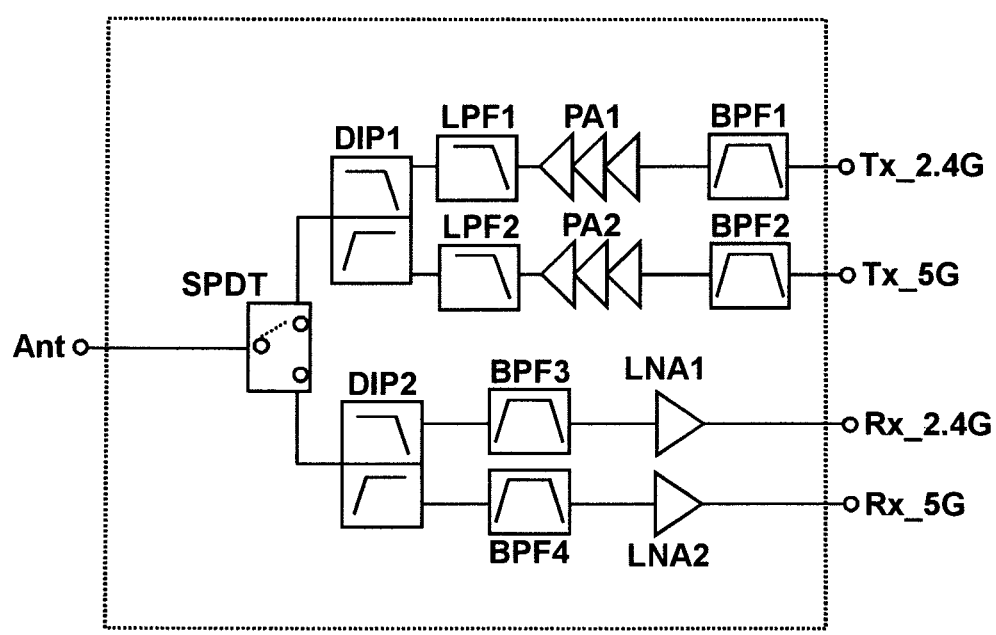
FIG. 11 is a view showing the equivalent circuit of one example of the high-frequency devices of the present invention.

FIG. 11 shows the equivalent circuit of a high-frequency circuit constituting a front-end module for wireless LAN as one example of high-frequency devices. The front-end module shown in FIG. 11 comprises an antenna terminal Ant connected to an antenna, a transmitting terminal Tx__2.4 G to which 2.4-GHz-band transmitting signals are input, a transmitting terminal Tx__5 G to which 5-GHz-band transmitting signals are input, a receiving terminal Rx__2.4 G from which 2.4-GHz-band received signals are output, a receiving terminal Rx__5 G from which 5-GHz-band received signals are output, and a switch circuit SPDT for connecting the antenna terminal Ant to the transmitting terminals Tx__2.4 G, Tx__5 G or the receiving terminals Rx__2.4 G, Rx__5 G. The switch circuit SPDT has a common terminal connected to the antenna terminal Ant, and two switch terminals connected to a transmission-side diplexer circuit DIP1 and a receiving-side diplexer circuit DIP2, respectively. A high-frequency amplifier circuit PA1 for amplifying 2.4-GHz-band transmitting signals are connected between the transmission-side diplexer circuit DIP1 and the transmitting terminal Tx__2.4 G, and a high-frequency amplifier circuit PA2 for amplifying 5-GHz-band transmitting signals are connected between the transmission-side diplexer circuit DIP1 and the transmitting terminal Tx__5 G The high-frequency amplifier circuits PA1, PA2 are connected to bandpass filters BPF1, BPF2 on the input side, and lowpass filters LPF1, LPF2 on the output side. A low-noise amplifier circuit LNA1 for amplifying 2.4-GHz-band received signals is connected between the receiving-side diplexer circuit DIP2 and the receiving terminal Rx__2.4 G, and a low-noise amplifier circuit LNA2 for amplifying 5-GHz-band received signals is connected between the receiving-side diplexer circuit DIP2 and the receiving terminal Rx__5 G. The low-noise amplifier circuits LNA1, LNA2 are connected on the output side to bandpass filters BPF3, BPF4 of the present invention. IC chips for the switch circuit SPDT, the high-frequency amplifier circuits PA1, PA2, and the low-noise amplifier circuits LNA1, LNA2 are mounted on the laminate substrate.

Ceramic laminate substrates having conductor patterns shown in FIGS. 1(*a*), 3, 4, 6, 8 and 10 can be produced, for example, by printing green sheets of 10-200 μm in thickness made of dielectric ceramic materials LTCC sinterable at low temperatures of 1000° C. or lower (low temperature co-fired ceramics) with a conductive paste of low-resistivity Ag, Cu, etc. to form predetermined electrode patterns, and integrally laminating and sintering pluralities of green sheets. The dielectric ceramic materials may be those having dielectric constants of about 5-15, for example, (a) materials comprising Al, Si and Sr as main components and Ti, Bi, Cu, Mn, Na and K as sub-components, (b) materials comprising Al, Si and Sr as main components and Ca, Pb, Na and K as sub-components, (c) materials comprising Al, Mg, Si and Gd, (d) materials comprising Al, Si, Zr and Mg, etc. The dielectric materials may also be resins, or composite materials of resins and dielectric ceramic powder. The laminate substrate may be produced by an H TCC (high-temperature-cofirable ceramics) technology using alumina-based, dielectric ceramic materials and high-temperature-sinterable metals such as tungsten, molybdenum, etc. When the bandpass filter is constituted by a ceramic laminate substrate, resonance line conductor strip patterns, capacitance electrode patterns, wiring electrode patterns, ground electrode patterns and via-conductors are formed on and in layers to constitute the desired circuits.

The bandpass filter of the present invention can be used not only in high-frequency switch modules, but also in other high-frequency devices. High-frequency devices comprising the bandpass filters of the present invention can be used for various communications apparatuses such as cell phones, Bluetooth (registered trademark) communications equipments, wireless LAN communications equipments (802.11a/b/g/n), WIMAX (802.16e), IEEE802.20 (I-burst), etc. For example, the high-frequency device of the present invention as a high-frequency front-end module usable for two communications systems of 2.4-GHz-band wireless LAN (IEEE802.11b and/or IEEE802.11g) and 5-GHz-band wireless LAN (IEEE802.11a), or a high-frequency front-end module usable for IEEE802.11n, can be used for small multiband communications apparatuses. The communications systems are not restricted to the above frequency bands and standards. Also, it can be used not only for two communications systems, but also for a larger number of communications systems using, for example, multistage diplexer circuits. The multiband communications apparatuses include, for example, wireless communications gears such as cell phones, personal computers (PCs), PC peripherals such as printers, hard disk drives and broadband rooters, domestic electronic appliances such as FAXs, refrigerators, standard televisions (SDTVs), high-definition televisions (HDTVs), digital cameras and digital video cameras, etc.

Effect of the Invention

The bandpass filter of the present invention has excellent attenuation characteristics not only near the passband but also at higher frequencies.

What is claimed is:

1. A bandpass filter comprising:
   three resonators arranged between two input/output terminals in a laminate substrate comprising a plurality of dielectric layers;
   each of the three resonators being constituted by a resonance line and a resonance capacitance connected in series to one end of said resonance line, and both ends of said each of the three resonators being grounded;
   wherein capacitance electrodes forming said resonance capacitances and said resonance lines are arranged on different dielectric layers among the plurality of dielectric layers,
   wherein the resonance lines and the capacitance electrodes are separated by a planar ground electrode covering the resonance lines and the capacitance electrodes when viewed in a lamination direction; and
   wherein each of said input/output terminals is connected to respective a via-conductor path between the resonance line and the capacitance electrode of each of two of the three resonators via a corresponding connecting line, and a junction of each of said input/output terminals connecting to said respective via-conductor path is formed in said laminate substrate so that each of said junctions is positioned closer to said respective capacitance electrode than said respective resonance line in the lamination direction.

2. The bandpass filter according to claim 1, wherein said input/output terminals are connected to said via-conductor paths on a dielectric layer, among the different dielectric layers, on which said capacitance electrode forming said resonance capacitance of the at least one of the three resonators is arranged.

3. The bandpass filter according to claim 1, wherein each resonance line has said one end connected to each resonance capacitance through a first via-conductor, and the other end connected to said planar ground electrode through a second via-conductor.

4. The bandpass filter according to claim 1, comprising a coupling capacitance for coupling said resonance lines, coupling capacitance electrodes forming said coupling capacitance are arranged on different ones of said dielectric layers from those on which said resonance lines are formed, and the resonance lines and the coupling capacitance electrodes are separated by said planar ground electrode.

5. The bandpass filter according to claim 4, wherein said capacitance electrodes forming said resonance capacitances and said coupling capacitance electrodes forming said coupling capacitance are sandwiched by the planar ground electrode and another ground electrode.

6. The bandpass filter according to claim 4, wherein said coupling capacitance electrodes being constituted by pluralities of opposing coupling capacitance electrodes connected to the resonance lines; and wherein an opposing portion of one coupling capacitance electrode in one of the pluralities of opposing coupling capacitance electrodes covers an opposing portion of the other coupling capacitance electrode in said one of the pluralities of opposing coupling capacitance electrodes with a margin when viewed in the lamination direction.

7. The bandpass filter according to claim 1, wherein said resonance lines are arranged in parallel such that adjacent ones are electromagnetically coupled,
   wherein each resonance line is constituted by serially connecting both ends of pluralities of conductor strip patterns formed on two or more dielectric layers, among the plurality of layers, and wherein part of the conductor strip patterns are arranged on same dielectric layers, among the two or more dielectric layers, and the remaining part thereof are arranged on different dielectric layers, among the two or more dielectric layers, such that adjacent resonance lines are arranged with displacement in the lamination direction.

8. The bandpass filter according to claim 7, wherein said resonance lines comprise three or more parallel resonance lines displaced in the lamination direction.

9. The bandpass filter according to claim 7, comprising a coupling capacitance for coupling pluralities of said resonance lines; said coupling capacitance being constituted by pluralities of opposing coupling capacitance electrodes connected to the resonance lines; and pluralities of said opposing coupling capacitance electrodes being formed on different dielectric layers, among the plurality of dielectric layers, from those on which said resonance lines are formed, and the resonance lines and the pluralities of opposing coupling capacitance electrodes are separated by said planar ground electrode.

10. The bandpass filter according to claim 9, wherein an opposing portion of one coupling capacitance electrode in one of the pluralities of opposing coupling capacitance electrodes for said coupling capacitance electrodes covers an opposing portion of another coupling capacitance electrode in said one of the pluralities of opposing coupling capacitance electrodes for said coupling capacitance with a margin, when viewed in the lamination direction.

11. A high-frequency device comprising a high-frequency circuit for a communications apparatus, said high-frequency circuit comprising a laminate comprising pluralities of dielectric layers provided with electrode patterns, devices mounted on said laminate, and the bandpass filter recited in claim 1.

12. A communications apparatus comprising the high-frequency device recited in claim 11.

13. The bandpass filter according to claim 1, wherein another of the three resonators is connected to another input/output terminal, and a junction of said other input/output terminal connecting to a path between the resonance line and the capacitance electrode of the another one of the three resonators is closer to said capacitance electrodes than said resonance line in the lamination direction.

14. The bandpass filter according to claim 1, wherein each resonance line comprises a plurality of conductor strip patterns formed on two or more of the plurality of dielectric layers, wherein each of the resonance lines have a same number of said plurality of conductor strip patterns.

15. The bandpass filter according to claim 1, wherein conductor strip patterns of adjacent ones of the three resonance lines are displaced such that the conductor strip patterns of the adjacent resonance lines are not provided in the same two or more dielectric layers of the plurality of dielectric layers.

16. The bandpass filter according to claim 1, wherein each said input/output terminal comprises an input terminal and an output terminal, and each said junction comprises a first junction corresponding to the input terminal and a second junction corresponding to the output terminal.

17. The bandpass filter according to claim 16, wherein a capacitor is connected between the first junction and the second junction.

18. The bandpass filter according to claim 1, wherein the planar ground electrode covers the entire structure of the laminate substrate except for one or more locations of one or more via holes.

* * * * *